United States Patent
Prest

(10) Patent No.: US 10,957,483 B2
(45) Date of Patent: Mar. 23, 2021

(54) INDUCTION COIL ASSEMBLY AND METHOD FOR MANUFACTURING SAME

(71) Applicant: Caterpillar Inc., Peoria, IL (US)

(72) Inventor: Paul Prest, Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 0 days.

(21) Appl. No.: 16/714,627

(22) Filed: Dec. 13, 2019

(65) Prior Publication Data
US 2020/0118741 A1    Apr. 16, 2020

Related U.S. Application Data

(63) Continuation of application No. 15/408,029, filed on Jan. 17, 2017, now Pat. No. 10,546,689.

(51) Int. Cl.
| | |
|---|---|
| *H01F 41/04* | (2006.01) |
| *H05B 6/42* | (2006.01) |
| *G05B 19/4099* | (2006.01) |
| *H01L 41/04* | (2006.01) |
| *H05K 3/00* | (2006.01) |
| *H05K 3/12* | (2006.01) |
| *B23K 1/002* | (2006.01) |
| *B23K 13/01* | (2006.01) |

(Continued)

(52) U.S. Cl.
CPC ............ *H01F 41/043* (2013.01); *B23K 1/002* (2013.01); *B23K 3/0475* (2013.01); *B23K 13/01* (2013.01); *G05B 19/4099* (2013.01); *H01L 41/04* (2013.01); *H01L 41/042* (2013.01); *H05B 6/42* (2013.01); *H05K 3/0005* (2013.01); *H05K 3/125* (2013.01); *B23K 2101/36* (2018.08); *B23K 2103/12* (2018.08); *B33Y 80/00* (2014.12); *G05B 2219/35134* (2013.01); *G05B 2219/49007* (2013.01); *H05B 6/36* (2013.01); *H05B 6/362* (2013.01); *H05B 6/38* (2013.01); *H05B 6/40* (2013.01); *Y02P 90/02* (2015.11); *Y10T 29/42* (2015.01)

(58) Field of Classification Search
CPC ....... B23K 1/002; B23K 3/0475; B23K 13/01
USPC ................................ 219/639, 659, 661, 662
See application file for complete search history.

(56) References Cited

U.S. PATENT DOCUMENTS

| | | | | |
|---|---|---|---|---|
| 4,757,170 A | * | 7/1988 | Mucha ..................... | C21D 9/32 219/640 |
| 8,716,636 B2 | * | 5/2014 | Bollman .................. | C21D 1/10 219/635 |

(Continued)

*Primary Examiner* — Tu B Hoang
*Assistant Examiner* — Thomas J Ward
(74) *Attorney, Agent, or Firm* — Hibshman Claim Construction PLLC

(57) ABSTRACT

An induction coil assembly includes an annular member extending from a first end to a second end, and extending about a longitudinal axis; a first leg extending from the first end of the annular member, and including a first electrical connection portion and a first axial portion; and a second leg extending from the second end of the annular member, and including a second electrical connection portion and a second axial portion. An internal surface of the annular member defines a first fluid passage through the annular member. An internal surface of the first leg defines a second fluid passage through the first leg. An internal surface of the second leg defines a third fluid passage through the second leg. The second fluid passage is in fluid communication with the third fluid passage via the first fluid passage.

14 Claims, 5 Drawing Sheets

(51) Int. Cl.
  *B23K 3/047* (2006.01)
  *B23K 101/36* (2006.01)
  *B23K 103/12* (2006.01)
  *H05B 6/40* (2006.01)
  *H05B 6/36* (2006.01)
  *H05B 6/38* (2006.01)
  *B33Y 80/00* (2015.01)

(56) References Cited

U.S. PATENT DOCUMENTS

2009/0010627 A1* 1/2009 Lindsay .............. A61M 1/1656
 392/466
2015/0125334 A1 5/2015 Uetani et al.

* cited by examiner

INDUCTION COIL ASSEMBLY AND METHOD FOR MANUFACTURING SAME

CROSS-REFERENCE TO RELATED APPLICATIONS

This application is a Continuation of U.S. application Ser. No. 15/408,029, filed on Jan. 17, 2017, the disclosure of which being hereby incorporated by reference in its entirety.

TECHNICAL FIELD

The present disclosure relates to an induction coil assembly, and more specifically to a method for manufacturing the induction coil assembly.

BACKGROUND

Copper induction coil assemblies are usually employed in various induction heating applications, such as induction hardening, induction brazing, induction tempering, induction bonding, induction pre-heating and induction post-heating. For performing induction heating, induction coils are supplied with an electric power to generate electromagnetic field. Such electromagnetic field generates induced electric current within an electrically conducting component disposed in proximity of the induction coil. The induced electric current generates heat within the electrically conducting component.

Typically, various components of a copper induction coil assembly are manufactured using various manual manufacturing techniques. However, such manual manufacturing of the copper induction coil assembly consumes undesirable amount of time. Also, various components of the copper induction coil assembly formed by the manual manufacturing techniques may lack dimensional accuracy. This may reduce efficiency of heat treatment performed on the electrically conducting component. Further, the copper induction coil assembly manufactured by manual manufacturing techniques may be susceptible to distortion while performing the heat treatment on the electrically conducting component. Furthermore, the manual manufacturing techniques may be undesirable for manufacturing the induction coil assembly with complex dimensional characteristics.

U.S. Pat. No. 9,087,636, hereinafter referred to as the '636 patent, describes a method for producing a coil. The '636 patent relates to a method for producing a coil integrated in a substrate or applied to a substrate. The coil has first winding portions, each of which has first ends and second ends. The coil has second winding portions and third winding portions. Each two of the first ends are electrically interconnected by the second winding portions. Two corresponding second ends of the first winding portions are electrically interconnected by the third winding portions, such that coil windings of the coil are formed hereby. At least the first winding portions are applied by means of a 3D printing method, wherein this is aerosol jet or inkjet printing, for example. However, the '636 patent does not disclose method for manufacturing an induction coil assembly for heat treatment application.

SUMMARY OF THE DISCLOSURE

According to an aspect of the disclosure, an induction coil assembly includes an annular member extending from a first end to a second end, and extending about a longitudinal axis, the longitudinal axis being aligned with an axial direction; a first leg extending from the first end of the annular member, and including a first electrical connection portion and a first axial portion; and a second leg extending from the second end of the annular member, and including a second electrical connection portion and a second axial portion. An internal surface of the annular member defines a first fluid passage through the annular member. An internal surface of the first leg defines a second fluid passage through the first leg, and a wall of the first leg defines a first fluid port in fluid communication with the second fluid passage. The first axial portion extends along the axial direction and at least partly defines the second fluid passage. The first electrical connection portion is in electrical communication with the second electrical connection portion via the annular member. An internal surface of the second leg defines a third fluid passage through the second leg, and a wall of the second leg defines a second fluid port in fluid communication with the third fluid passage. The second axial portion extends along the axial direction and at least partly defining the third fluid passage. The first fluid port is in fluid communication with the second fluid port via the first fluid passage.

Other features and aspects of this disclosure will be apparent from the following description and the accompanying drawings.

DETAILED DESCRIPTION

Reference will now be made in detail to specific embodiments or features, examples of which are illustrated in the accompanying drawings. Wherever possible, corresponding or similar reference numbers will be used throughout the drawings to refer to the same or corresponding parts.

Figure 1:
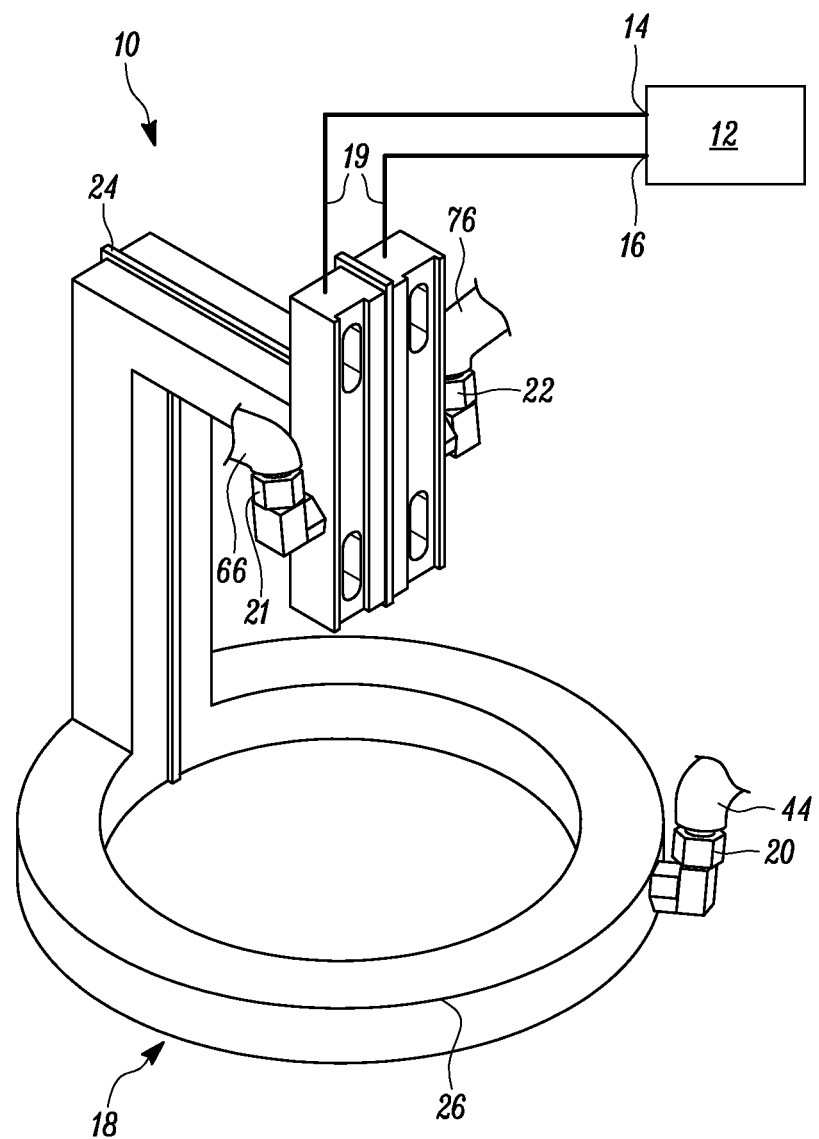
FIG. 1 is a perspective view of an induction coil assembly connected to an electric power source, according to one embodiment of the present disclosure.

FIG. 1 illustrates a perspective view of an induction coil assembly 10 connected to an electric power source 12. The induction coil assembly 10 is employed in a heat treatment application. In various examples, the heat treatment application may include, but is not limited to, induction hardening, induction brazing, induction tempering, induction bonding, induction pre-heating, and induction post-heating. The induction coil assembly 10 is used to perform heat treatment operation on a work piece (not shown). In various examples, the work piece may include, but is not limited to, a sealing element, a shaft, or any electrically conductive work piece known in the art.

The induction coil assembly 10 is connected to the electric power source 12 to receive electric current. The electric power source 12 includes a positive terminal 14 and a negative terminal 16. The positive terminal 14 and the negative terminal 16 are electrically coupled to the induction coil assembly 10 via wires 19. The electric current supplied in the induction coil assembly 10 from the electric power source 12 causes generation of electromagnetic field around the induction coil assembly 10. The electromagnetic field around the induction coil assembly 10 induces an electric current, also referred to as eddy current or induced electric current, in the work piece positioned in proximity of the induction coil assembly 10. The induced electric current generates heat within the work piece.

Figure 2:
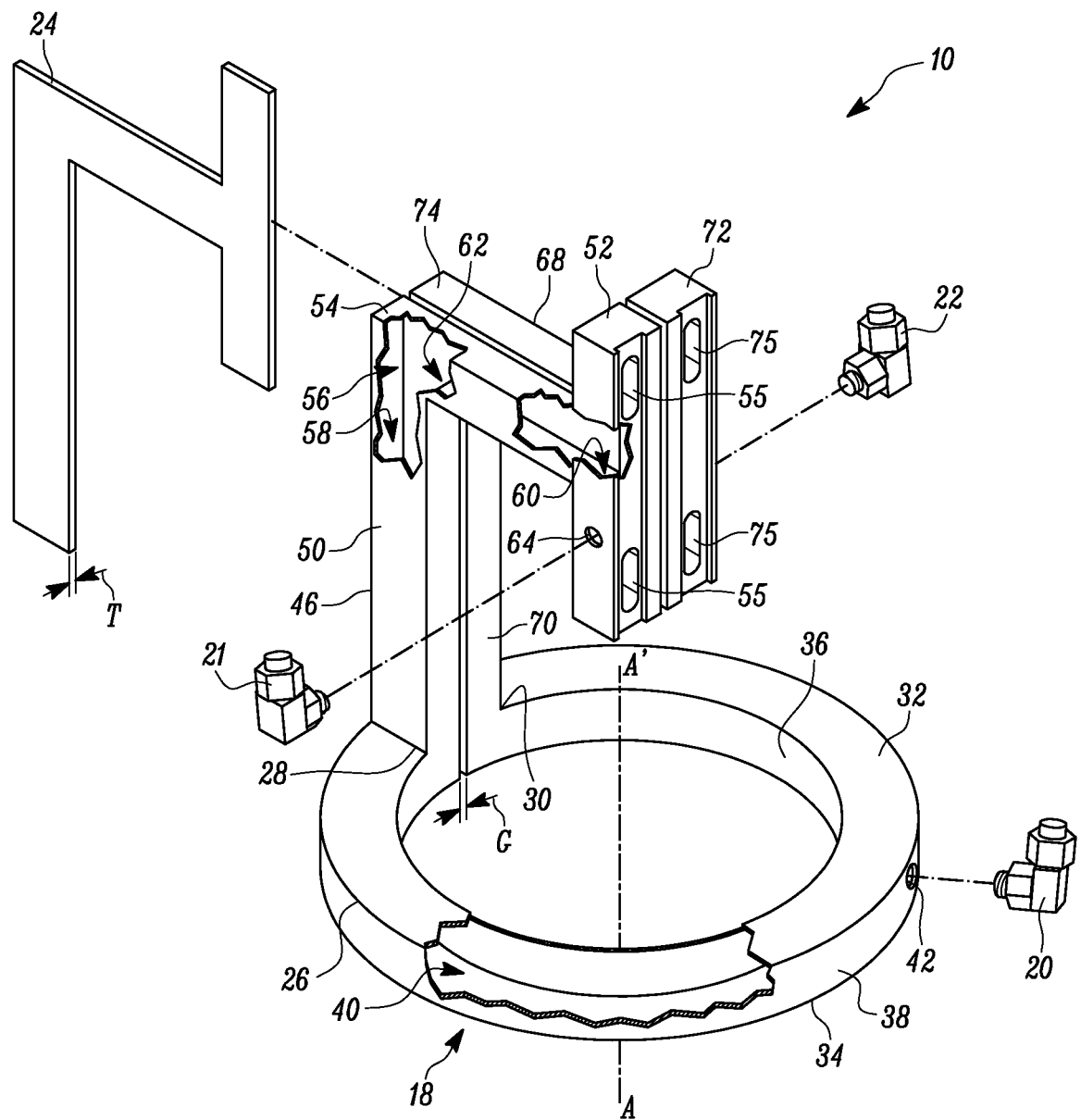
FIG. 2 is an exploded view of the induction coil assembly of FIG. 1 illustrating a partial sectional view of an induction coil of the induction coil assembly.

FIG. 2 illustrates an exploded view of the induction coil assembly 10. Referring to FIG. 1 and FIG. 2, the induction coil assembly 10 includes the induction coil 18, multiple coupling members 20, 21, 22, and an insulator 24. The induction coil 18 is manufactured using a Three Dimensional (3D) printing machine 25, which will be described in detail with reference to FIG. 3. A partial sectional view of the induction coil 18 is also shown in the FIG. 2 for illustration purpose of the present disclosure. In the present embodiment, the induction coil 18 has a substantially circular shape. In various other embodiments, the induction coil 18 may have a square shape, a rectangular shape or any other known shape based on the application of the induction coil 18. The induction coil 18 includes an annular member 26 having a first end 28 and a second end 30. The first end 28 and the second end 30 are spaced apart in a manner that a gap 'G' is defined between the first end 28 and the second end 30. The annular member 26 includes a top surface 32, a bottom surface 34, an inner circumferential surface 36, and an outer circumferential surface 38.

The annular member 26 also includes a fluid passage 40, interchangeably referred to as 'the first fluid passage 40', to receive coolant therewithin from a coolant reservoir (not shown). The first fluid passage 40 extends from the first end 28 of the annular member 26 to the second end 30 of the annular member 26. The annular member 26 also includes a hole 42, interchangeably referred to as 'the first hole 42', to receive the coolant from the coolant reservoir. The first hole 42 is defined in the outer circumferential surface 38 of the annular member 26 to receive the coolant. The first hole 42 is in fluid communication with the first fluid passage 40 defined within the annular member 26. Although the annular member 26, shown in the accompanying figures, includes one first hole 42, it should be understood that the annular member 26 may include a plurality of first holes 42 based on operational characteristics and dimensional characteristics of the induction coil 18.

The first hole 42 receives the coupling member 20. In one example, the coupling member 20 may be threadably received within the first hole 42. In another example, the coupling member 20 may be fixedly received within the first hole 42. The coupling member 20 fluidly communicates the first fluid passage 40 of the annular member 26 with a cooling system (not shown) via a fluid hose 44 (shown in FIG. 1), interchangeably referred to as 'the inlet fluid hose 44'. More specifically, the inlet fluid hose 44 is in fluid communication with the first fluid passage 40 through the coupling member 20 received within the first hole 42. The inlet fluid hose 44 supplies the coolant from the cooling system to the first fluid passage 40 through the first hole 42.

The induction coil 18 also includes a first leg 46 extending from the first end 28 of the annular member 26. The first leg 46 is coupled with the positive terminal 14 of the electric power source 12. The first leg 46 includes a first vertical portion 50, a first connector portion 52, and a first horizontal portion 54. The first vertical portion 50 of the first leg 46 extends from the first end 28 of the annular member 26 along a direction substantially parallel to a longitudinal axis A-A' defined by the annular member 26. The first horizontal portion 54 extends from the first vertical portion 50 in a direction substantially perpendicular to the longitudinal axis A-A' defined by the annular member 26. The first connector portion 52 of the first leg 46 extends from the first horizontal portion 54 in a direction substantially parallel to the longitudinal axis A-A' defined by the annular member 26. The first connector portion 52 includes a first pair of holes 55 to assist mounting of the induction coil assembly 10 on a fixture (not shown) used in various heat treatment applications.

The first leg 46 also includes a fluid passage 56, interchangeably referred to as 'the second fluid passage 56', to receive the coolant therein. The second fluid passage 56 includes a first vertical passage 58, a first connector passage 60, and a first horizontal passage 62. The first vertical passage 58 is defined within the first vertical portion 50 of the first leg 46. The first vertical passage 58 is in fluid communication with the first fluid passage 40 of the annular member 26 to receive the coolant. The first horizontal passage 62 is defined within the first horizontal portion 54 of the first leg 46. The first horizontal passage 62 is in fluid communication with the first fluid passage 40 of the annular member 26 through the first vertical passage 58 to receive the coolant. The first connector passage 60 is defined within the first connector portion 52 of the first leg 46. The first connector passage 60 is in fluid communication with the first fluid passage 40 of the annular member 26 through the first vertical passage 58 and the first horizontal passage 62 to receive the coolant.

The first leg 46 also includes a hole 64, interchangeably referred to as 'the second hole 64', defined in the first connector portion 52 to discharge the coolant. More specifically, the second hole 64 is used to discharge the coolant received within the second fluid passage 56 from the first fluid passage 40. The second hole 64 receives the coupling member 21. In one example, the coupling member 21 may be threadably received within the second hole 64. In another example, the coupling member 21 may be fixedly received within the second hole 64. The coupling member 21 disposed within the second hole 64 fluidly couples the second fluid passage 56 with the cooling system, via a fluid hose 66 (shown in FIG. 1), interchangeably referred to as 'the first outlet hose 66'. The coolant received within the second fluid passage 56 from the first fluid passage 40 is discharged to the cooling system through the first outlet hose 66 connected to the second fluid passage 56 via the coupling member 21 received within the second hole 64.

The induction coil 18 also includes a second leg 68 extending from the second end 30 of the annular member 26. The second leg 68 and the first leg 46 are coupled to the second end 30 and the first end 28, respectively, of the annular member 26 in a manner that the gap 'G' maintained between the first leg 46 and the second leg 68. The second leg 68 includes a second vertical portion 70, a second connector portion 72, and a second horizontal portion 74. The second vertical portion 70 of the second leg 68 extends from the second end 30 of the annular member 26 along a direction substantially parallel to the longitudinal axis A-A' of the annular member 26. The second horizontal portion 74 extends from the second vertical portion 70 along a direction substantially perpendicular to the longitudinal axis A-A' of the annular member 26. The second connector portion 72 extends from the second horizontal portion 74 along a direction substantially parallel to the longitudinal axis A-A' of the annular member 26. The second connector portion 72 includes a second pair of holes 75 to assist mounting of the induction coil assembly 10 on the fixture.

Further, the second leg 68 also includes a fluid passage (not shown), interchangeably referred to as 'the third fluid passage', to receive the coolant therein. The third fluid passage of the second leg 68 is in fluid communication with the first fluid passage 40 of the annular member 26 to receive the coolant. Although the third fluid passage is not shown in the accompanying figures, it should be understood that the third fluid passage of the second leg 68 and the second fluid passage 56 of the first leg 46 have identical dimensional characteristics.

The second leg 68 also includes a hole (not shown), interchangeably referred to as 'the third hole'. The third hole is defined in the second connector portion 72 to discharge the coolant. More specifically, the third hole is used to discharge the coolant received within the third fluid passage from the first fluid passage 40. The third hole receives the coupling member 22. In one example, the coupling member 22 may be threadably received within the third hole. In another example, the coupling member 22 may be fixedly received within the third hole. The coupling member 22 disposed within the third hole fluidly couples the third fluid passage with the cooling system, via a fluid hose 76 (shown in FIG. 1), interchangeably referred to as 'the second outlet hose 76'. The coolant received within the third fluid passage from the first fluid passage 40 is discharged to the cooling system through the second outlet hose 76 connected to the second fluid passage 56 via the coupling member 22 received within the third hole. The first leg 46 and the second leg 68 of the induction coil 18 have identical constructional characteristics and dimensional characteristics.

The induction coil assembly 10 also includes the insulator 24 to electrically isolate the first leg 46 from the second leg 68. The insulator 24 of the induction coil assembly 10 is inserted between the first leg 46 and the second leg 68 of the induction coil 18. The insulator 24 has substantially similar shape as of the first leg 46 of the induction coil 18 and the second leg 68 of the induction coil 18. In an example, the insulator 24 may have different shape in comparison to the first leg 46 and the second leg 68. The insulator 24 has a thickness 'T' substantially equal to the gap 'G' defined between ends, such as the first end 28 and the second end 30, and between legs, such as the first leg 46 and the second leg 68. More specifically, the insulator 24 is inserted in the gap 'G' defined between the ends, such as the first end 28 and the second end 30, and between the legs, such as the first leg 46 and the second leg 68, thereby electrically isolating the first leg 46 from the second leg 68.

Figure 3:
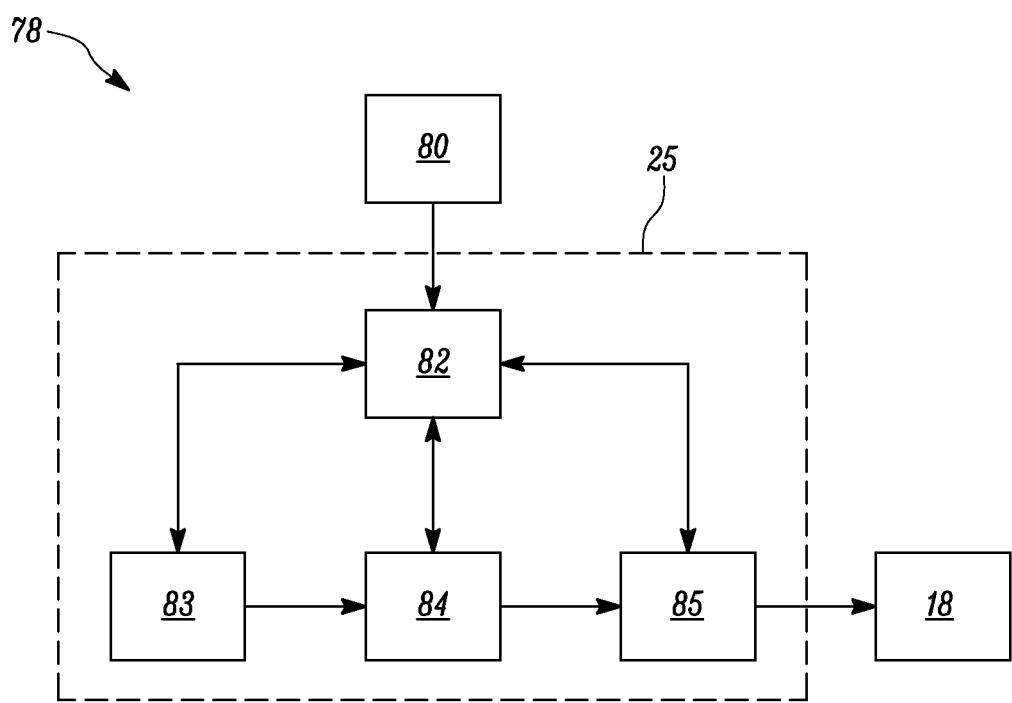
FIG. 3 is a schematic block diagram of a system for manufacturing the induction coil of the induction coil assembly of FIG. 2.

FIG. 3 illustrates a schematic block diagram of a system 78 for manufacturing the induction coil 18 of the induction coil assembly 10. The system 78 is embodied as additive manufacturing equipment. The system 78 includes a processing device 80 and the Three Dimensional (3D) printing machine 25. The processing device 80 is capable of transmitting and receiving modelling and analyzing instructions associated with manufacturing of the induction coil 18. For example, the processing device 80 can receive modelling and analyzing instructions from a Graphical User Interface (GUI) (not shown). The processing device 80 can embody a single microprocessor or multiple microprocessors for receiving signals from the various components of the system 78. Numerous commercially available microprocessors can be configured to perform the functions of the processing device 80.

The processing device 80 generates a 3D model, interchangeably referred to as 'the Computer Aided Design (CAD) model, of the induction coil 18 based on a set of instructions received from the GUI. Various routines, algorithms, and/or programs can be programmed within the processing device 80 for execution thereof and to generate the CAD model of the induction coil 18. In various other examples, the processing device 80 may be communicably coupled to an image capturing module (not shown) or a Three Dimensional (3D) scanner (not shown) to capture one or more images of the induction coil 18 to be formed. The set of instructions received by the processing device 80 from the GUI may indicate a set of geometrical characteristics and constructional characteristics associated with the induction coil 18. Further, the processing device 80 is programmed to slice the CAD model of the induction coil 18 into a plurality of layers. In an example, the processing device 80 may slice the CAD model of the induction coil 18 based on a set of user instructions received via the GUI.

The 3D printing machine 25 is in communication with the processing device 80. The 3D printing machine 25 is operated to deposit a plurality of layers of copper material one above other to manufacture the induction coil 18 corresponding to the CAD model of the induction coil 18. An exemplary construction of the 3D printing machine 25 is discussed in detail herein below for illustration purpose of the present disclosure. The 3D printing machine 25 includes a controller 82, a reservoir 83, a dispensing member 84, and a printing head 85.

The controller 82 is in communication with the processing device 80 for receiving the CAD model of the induction coil 18. In an example, the controller 82 may be implemented as one or more microprocessors, microcomputers, digital signal processors, central processing units, state machines, logic circuitries, and/or any device that is capable of manipulating signals based on operational instructions. Among the capabilities mentioned herein, the controller 82 may also be configured to receive, transmit, and execute computer-readable instructions. The controller 82 may also include a processor (not shown) that includes one or more processing units, all of which include multiple computing units. The processor may be implemented as hardware, software, or a combination of hardware and software capable of executing a software application.

The reservoir 83 is in communication with the controller 82. The reservoir 83 is used to store the copper material for manufacturing the induction coil 18. In an example, the reservoir 83 may store the copper material in a form of filaments. The reservoir 83 supplies the copper material to the dispensing member 84 for manufacturing the induction coil 18.

The dispensing member 84 is in communication with the controller 82. The dispensing member 84 receives commands/signals from the controller 82. The dispensing member 84 supplies the copper material to the printing head 85 based on the commands/signals received from the controller 82. In an example, the dispensing member 84 may include a liquefier to transform the filaments of the copper material received from the reservoir 83 into molten copper material. The printing head 85 supplies the copper material received from the dispensing member 84 to a printing bed (not shown) for manufacturing the induction coil 18.

The printing head 85 is also in communication with the controller 82. The printing head 85 deposits the plurality of layers of the copper material one above other to manufacture the induction coil 18 based on the plurality of layers of the CAD model sliced by the processing device 80. The printing head 85 follows a path defined by the controller 82 to deposit the plurality of layers of the copper material on the printing bed. In one example, the dispensing member 84 may be coupled to the printing head 85 to facilitate dispensing of the copper material to manufacture the induction coil 18. In another example, the dispensing member 84 and the printing head 85 may be separately mounted on a translation unit (not shown) to facilitate dispensing of the copper material to manufacture the induction coil 86.

In one example, the first hole 42, the second hole 64, and the third hole of the annular member 26, the first leg 46, and the second leg 68, respectively, may be manufactured by using the 3D printing machine 25 during manufacturing of the induction coil 18. In another example, the first hole 42, the second hole 64, and the third hole of the annular member 26, the first leg 46, and the second leg 68, respectively, may be manufactured by performing various manufacturing techniques using machines, such as a tapping machine, a drilling machine, or a milling machine, on the induction coil 18 manufactured using the 3D printing machine 25.

Figure 4:
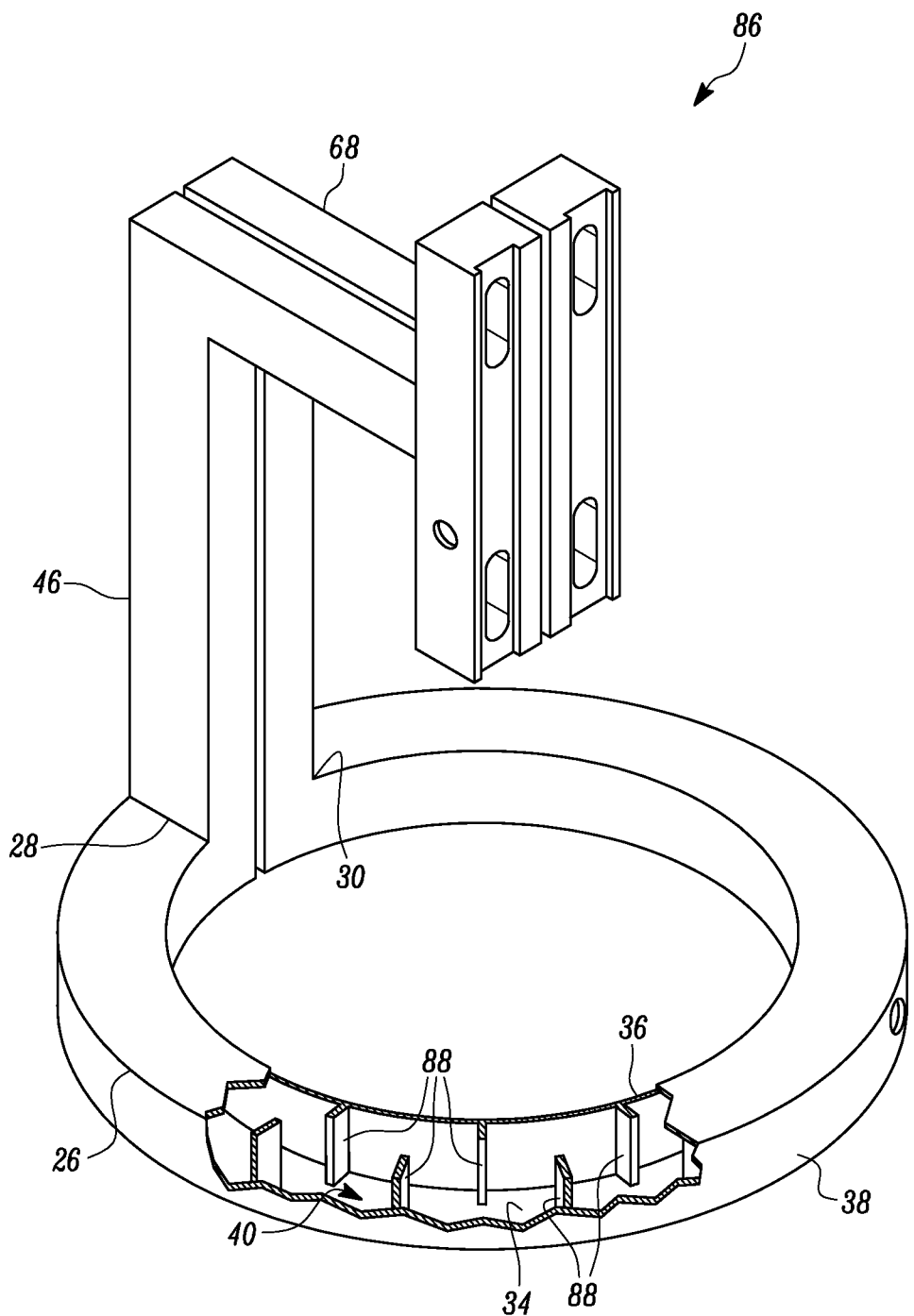
FIG. 4 is a partial sectional view of an induction coil manufactured by the system of FIG. 3, according to another embodiment of the present disclosure.

FIG. 4 illustrates a partial sectional view of an induction coil 86 manufactured by the system 78, according to another embodiment of the present disclosure. Similar to the induction coil 18 shown in FIG. 2, the induction coil 86 shown in FIG. 4 includes the annular member 26, the first leg 46 extending from the first end 28 of the annular member 26, and the second leg 68 extending from the second end 30 of the annular member 26. Similar to the induction coil 18 of FIG. 2, the annular member 26 of the induction coil 86 also includes the first fluid passage 40 to receive the coolant from the cooling system. The induction coil 18 also includes a number of baffle plates 88 defined within the first fluid passage 40 of the annular member 26 to adjust a flow of the coolant. More specifically, the baffle plates 88 are radially defined on the inner circumferential surface 36 and the outer circumferential surface 38 of the annular member 26. The baffle plates 88 defined on the outer circumferential surface 38 and the inner circumferential surface 36 are equally spaced from each other. In an example, the baffle plates 88 may be defined within the second fluid passage 56 of the first leg 46 and the third fluid passage of the second leg 68. In an example, the baffle plates 88 may be manufactured by using the 3D printing machine 25 during manufacturing of the induction coil 18. It should be understood that all other constructional details of the induction coil 86 is similar to the constructional details of the induction coil 18.

INDUSTRIAL APPLICABILITY

The induction coil 18 manufactured using the system 78 has precise dimensional characteristics. The system 78 includes the processing device 80 and the 3D printing machine 25 to manufacture the induction coil 18. This eliminates involvement of various manual manufacturing techniques used for manufacturing the induction coil 18, such that any dimensional inaccuracy associated with the induction coil 18 manufactured by the manual manufacturing techniques is reduced. Moreover, owing to precise dimensional characteristics of the induction coil 18, efficiency of heat treatment operation performed on the work piece using the induction coil 18 is substantially improved.

Figure 5:
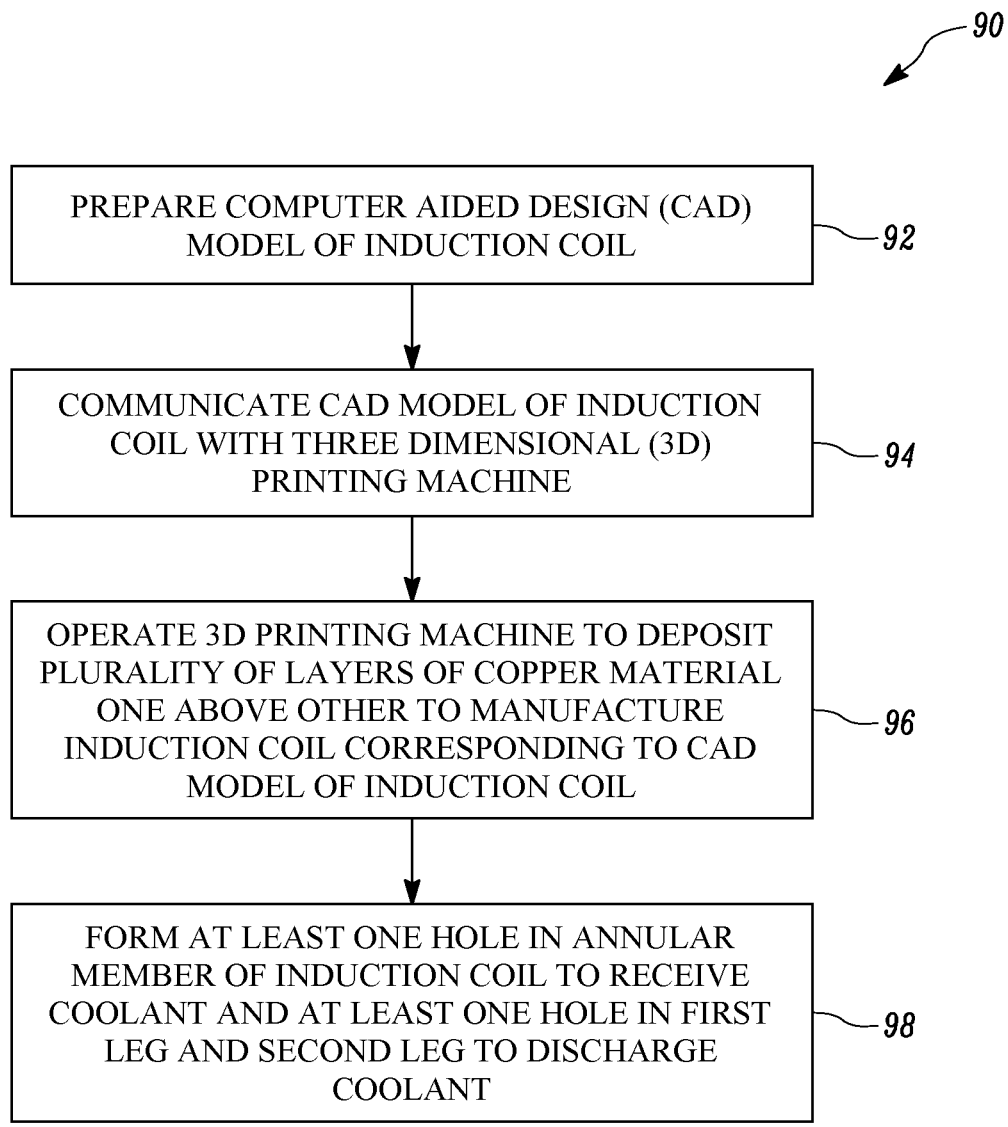
FIG. 5 is a flowchart of a method for manufacturing the induction coil assembly of FIG. 1.

The present disclosure relates to a method 90 for manufacturing the induction coil assembly 10. FIG. 5 illustrates a flowchart of the method 90 for manufacturing the induction coil assembly 10. For the sake of brevity, the embodiments of the present disclosure, which are already explained in the description of FIG. 1, FIG. 2, FIG. 3, and FIG. 4, are not explained in detail with regard to the description of the method 90.

At block 92, the method 90 includes preparing the CAD model of the induction coil 18. The CAD model is prepared by the processing device 80 based on the set of instructions received from the GUI. The set of instructions may be indicative of the set of geometrical characteristics of the induction coil 18. Further, the CAD model of the induction coil 18 is sliced into the plurality of layers by the processing device 80.

At block 94, the method 90 includes communicating the CAD model of the induction coil 18 with the 3D printing machine 25. The processing device 80 communicates the CAD model of the induction coil 18 to the 3D printing machine 25. More specifically, the processing device 80 communicates the CAD model of the induction coil 18 to the controller 82 of the 3D printing machine 25. At block 96, the method 90 includes operating the 3D printing machine 25 to deposit the plurality of layers of the copper material one above other to manufacture the induction coil 18 corresponding to the CAD model. The dispensing member 84 of the 3D printing machine 25 receives the copper material from the reservoir 83. Subsequently, the dispensing member 84 supplies the copper material to the printing head 85 of the 3D printing machine 25. The printing head 85 deposits the plurality of layers of the copper material on the printing bed based on the CAD model of the induction coil 18. More specifically, the printing head 85 follows the path defined by the controller 82 based on the CAD model to manufacture the induction coil 18.

At block 98, the method 90 includes forming at least one hole, such as the first hole 42, in the annular member 26 of the induction coil 18 to receive the coolant and at least one hole, such as the second hole 64 and the third hole, in the first leg 46 and the second leg 68 to discharge the coolant. In one example, the method 90 may include forming the first hole 42, the second hole 64, and the third hole in the annular member 26, the first leg 46, and the second leg 68, respectively, using the 3D printing machine 25. In another example, the method 90 may include forming the first hole 42, the second hole 64, and the third hole of the induction coil 18 by various machines, such as the tapping machine, the drilling machine, or the milling machine, on the induction coil 18 after the induction coil 18 is manufactured using the 3D printing machine 25.

The method 90 includes inserting the insulator 24 between the first leg 46 and the second leg 68 of the induction coil 18. The insulator 24 electrically isolates the first leg 46 of the induction coil 18 from the second leg 68 of the induction coil 18. In another embodiment, the method 90 may also include forming the baffle plates 88 within the first fluid passage 40 of the annular member 26.

The induction coil assembly 10 manufactured by the method 90 may be employed in any type of induction heating application, such as induction hardening, induction brazing, induction tempering, induction bonding, induction pre-heating, and induction post-heating. Therefore, the induction coil assembly 10 manufactured by the method 90 has a wide range of application across industries.

In an example, the induction coil assembly 10 of the present disclosure can be employed for performing induction hardening operation on a sealing element (not shown). In such an example, the sealing element may be mounted on the annular member 26 of the induction coil 18. More specifically, the sealing element may be mounted on the bottom surface 34 of the annular member 26. The bottom surface 34 may include a number of holes (not shown) for quenching the sealing element after completion of the induction hardening operation.

The induction coil 18 is manufactured by the 3D printing machine 25 based on the CAD model prepared by using the processing device 80. The processing device 80 can be employed for preparing the CAD model of the induction coil 18 having complex dimensional characteristics and constructional characteristics. Therefore, the method 90 allows manufacturing of the induction coil 18 having complex dimensional characteristics and constructional characteristics with ease and improved dimensional accuracy. The present disclosure offers the method 90 for manufacturing the induction coil assembly 10, which is simple, effective, and time saving.

While aspects of the present disclosure have been particularly shown and described with reference to the embodiments above, it will be understood by those skilled in the art that various additional embodiments may be contemplated by the modification of the disclosed machines, systems, and methods without departing from the spirit and scope of what is disclosed. Such embodiments should be understood to fall within the scope of the present disclosure as determined based upon the claims and any equivalents thereof.

The invention claimed is:

1. An induction coil assembly, comprising:
an annular member extending from a first end to a second end, and extending about a longitudinal axis, the longitudinal axis being aligned with an axial direction,
an internal surface of the annular member defining a first fluid passage through the annular member;
a first leg extending from the first end of the annular member, and including a first electrical connection portion and a first axial portion,
an internal surface of the first leg defining a second fluid passage through the first leg,
a wall of the first leg defining a first fluid port in fluid communication with the second fluid passage,
the first axial portion extending along the axial direction and at least partly defining the second fluid passage; and
a second leg extending from the second end of the annular member, and including a second electrical connection portion and a second axial portion, the first electrical connection portion being in electrical communication with the second electrical connection portion via the annular member,
an internal surface of the second leg defining a third fluid passage through the second leg,
a wall of the second leg defining a second fluid port in fluid communication with the third fluid passage,
the second axial portion extending along the axial direction and at least partly defining the third fluid passage,
the first fluid port being in fluid communication with the second fluid port via the first fluid passage,
wherein the first leg further includes a first transverse portion extending along a depth direction, the depth direction being perpendicular to the axial direction, the first axial portion being disposed between the first transverse portion and the annular member along the axial direction,
the first transverse portion including a first end coupled to the first axial portion and a second end disposed opposite the first end, the first transverse portion extending toward the annular member from the first end to the second end along the depth direction.

2. The induction coil assembly of claim 1, further comprising an electrical insulator disposed between the first leg and the second leg along a width direction, the width direction being perpendicular to the axial direction.

3. The induction coil assembly of claim 1, further comprising baffles disposed on the internal surface of the annular member and extending into the first fluid passage.

4. The induction coil assembly of claim 3, wherein the baffles are baffle plates.

5. The induction coil assembly of claim 1, further comprising an electrical insulator disposed between the first leg and the second leg along a width direction, the width direction being perpendicular to the axial direction and the depth direction.

6. The induction coil assembly of claim 1, wherein the second leg further includes a second transverse portion extending away from the second axial portion along the depth direction, the second axial portion being disposed between the second transverse portion and the annular member along the axial direction,
an internal surface of the second transverse portion defining a fifth fluid passage, the fifth fluid passage being in fluid communication with the first fluid passage through the annular member via the third fluid passage through the second axial portion of the second leg.

7. The induction coil assembly of claim 6, wherein the second transverse portion extends toward the annular member from the second axial portion along the depth direction.

8. The induction coil assembly of claim 7, further comprising an electrical insulator disposed between the first leg and the second leg along a width direction, the width direction being perpendicular to the axial direction and the depth direction.

9. The induction coil assembly of claim 1, wherein the first electrical connection portion extends along the axial direction, and the first axial portion is disposed between the first electrical connection portion and the annular member along the first leg.

10. The induction coil assembly of claim 6, wherein the first electrical connection portion extends along the axial direction,
the first axial portion is disposed between the first electrical connection portion and the annular member along the first leg,
the second electrical connection portion extends along the axial direction, and
the second axial portion is disposed between the second electrical connection portion and the annular member along the second leg.

11. The induction coil assembly of claim 1, wherein the first electrical connection portion extends along the axial direction,
the first axial portion is disposed between the first electrical connection portion and the annular member along the first leg,
the second electrical connection portion extends along the axial direction, and
the second axial portion is disposed between the second electrical connection portion and the annular member along the second leg.

12. The induction coil assembly of claim 1, wherein the induction coil assembly is made of copper by a three-dimensional printing process.

13. The induction coil assembly of claim 1, wherein the second end of the first transverse portion is disposed within a projection of the annular member along the axial direction.

14. The induction coil assembly of claim 1, wherein a portion of the annular member is disposed at a location along the depth direction that lies between a location of the first end of the first transverse portion along the depth direction and a location of the second end of the first transverse portion along the depth direction.

\* \* \* \* \*